United States Patent
Sakanishi

(10) Patent No.: US 10,466,592 B2
(45) Date of Patent: Nov. 5, 2019

(54) AGENT FOR RESIST HYDROPHILIZATION TREATMENT

(71) Applicant: DAICEL CORPORATION, Osaka-shi, Osaka (JP)

(72) Inventor: Yuichi Sakanishi, Tokyo (JP)

(73) Assignee: DAICEL CORPORATION, Osaka-Shi (JP)

(*) Notice: Subject to any disclaimer, the term of this patent is extended or adjusted under 35 U.S.C. 154(b) by 0 days.

(21) Appl. No.: 15/893,079

(22) Filed: Feb. 9, 2018

(65) Prior Publication Data

US 2018/0231890 A1    Aug. 16, 2018

(30) Foreign Application Priority Data

Feb. 10, 2017  (JP) ................. 2017-023181

(51) Int. Cl.

| | | |
|---|---|---|
| *G03F 7/16* | (2006.01) | |
| *H01L 21/308* | (2006.01) | |
| *H01L 21/304* | (2006.01) | |
| *G03F 7/32* | (2006.01) | |
| *G03F 7/40* | (2006.01) | |
| *G03F 7/039* | (2006.01) | |
| *H01L 21/027* | (2006.01) | |
| *G03F 7/38* | (2006.01) | |

(52) U.S. Cl.
CPC ............ *G03F 7/168* (2013.01); *G03F 7/039* (2013.01); *G03F 7/0392* (2013.01); *G03F 7/162* (2013.01); *G03F 7/32* (2013.01); *G03F 7/322* (2013.01); *G03F 7/38* (2013.01); *G03F 7/40* (2013.01); *H01L 21/0273* (2013.01); *H01L 21/304* (2013.01); *H01L 21/3081* (2013.01); *H01L 21/3086* (2013.01)

(58) Field of Classification Search
CPC ......... H01L 21/02043; H01L 21/30625; H01L 21/02021; B24B 9/065; B24B 37/02; G03F 7/168; G03F 7/38; G03F 7/40; C08K 5/053; C07C 43/11; C07C 43/135
USPC ........................................... 430/331
See application file for complete search history.

(56) References Cited

U.S. PATENT DOCUMENTS

| | | | | | |
|---|---|---|---|---|---|
| 3,586,504 A | * | 6/1971 | Coates et al. | ............ | G03F 7/322 430/141 |
| 3,637,774 A | * | 1/1972 | Babayan et al. | ...... | C07C 43/135 426/654 |
| 3,801,327 A | * | 4/1974 | Moreau | ................ | C07D 339/04 430/285.1 |
| 4,761,245 A | * | 8/1988 | Scardera | ................ | C09K 13/08 216/99 |
| 5,244,960 A | * | 9/1993 | Swarup | ..................... | C08F 2/30 524/507 |
| 8,409,360 B2 | * | 4/2013 | Koshiyama et al. | ... | C11D 1/667 134/22.1 |
| 8,999,071 B2 | * | 4/2015 | Tulchinsky | .............. | C11D 1/72 134/25.2 |
| 2005/0221615 A1 | | 10/2005 | Toyota et al. | | |
| 2007/0178701 A1 | | 8/2007 | Toyota et al. | | |
| 2009/0104778 A1 | * | 4/2009 | Sakanishi | ................ | C09G 1/02 438/692 |
| 2010/0086882 A1 | | 4/2010 | Murakami et al. | | |
| 2010/0104884 A1 | * | 4/2010 | Bloom et al. | ........ | C09D 133/06 428/500 |
| 2014/0242526 A1 | * | 8/2014 | Allen | ..................... | G03F 7/325 430/326 |
| 2015/0024596 A1 | * | 1/2015 | Minami | ............... | C09K 3/1409 438/693 |
| 2018/0195030 A1 | * | 7/2018 | Sakanishi | ................ | C11D 1/72 |

FOREIGN PATENT DOCUMENTS

| | | | | |
|---|---|---|---|---|
| EP | 2002987 A1 | * | 12/2008 | ............... B41N 3/06 |
| JP | 09-106081 A | | 4/1997 | |
| JP | 2005-277050 A | | 10/2005 | |
| JP | 2008-046153 A | | 2/2008 | |

OTHER PUBLICATIONS

"Number Prefix-Wikipedia", from Wikipedia Table of number prefixes in English downloaded Mar. 30, 2019 from the world wide web. 9 pages. (Year: 2019).*

* cited by examiner

*Primary Examiner* — Cynthia Hamilton
(74) *Attorney, Agent, or Firm* — Birch, Stewart, Kolasch & Birch, LLP

(57) ABSTRACT

Problem to be Solved
Provided is an agent for resist hydrophilization treatment that can hydrophilize a surface of a resist coating rapidly and stably while inhibiting deterioration of the resist coating.
Solution
An agent for resist hydrophilization treatment of the present invention comprises at least following components (A) and (B):
  component (A): a polyglycerol or a derivative thereof represented by following formula (a):

$$R^{a}O-(C_3H_6O_2)_n-H \qquad (a)$$

wherein $R^a$ represents a hydrogen atom, a hydrocarbon group having 1 to 18 carbon atoms optionally having a hydroxyl group, or an acyl group having 2 to 24 carbon atoms; and n represents an average polymerization degree of glycerol units shown in the parentheses, and is an integer from 2 to 60;
  component (B): water.

8 Claims, No Drawings

AGENT FOR RESIST HYDROPHILIZATION TREATMENT

TECHNICAL FIELD

The present invention relates to an agent for resist hydrophilization treatment that is to be applied to a resist coating surface to hydrophilize the resist coating surface, a developing liquid containing the agent for resist hydrophilization treatment, and a method for producing a semiconductor device using the agent for resist hydrophilization treatment. The present application claims priority to Japanese Patent Application No. 2017-023181 filed Feb. 10, 2017, the contents of which are incorporated herein by reference in their entirety.

BACKGROUND ART

To produce semiconductor devices (such as transistors, capacitors, memories, light emitting devices, and solar cells) or electronic equipment (such as various displays), a photolithography method including the following steps, for example, is utilized as a method for forming a circuit on a substrate:

[1] applying a photoresist onto a substrate to form a resist coating;

[2] irradiating the resist coating with light through a photomask having a circuit pattern drawn thereon, and baking the circuit pattern;

[3] immersing the resist coating in a developing liquid to remove portions of the resist coating excluding the pattern portion;

[4] curing the resist coating remaining after the development to form a mask; and

[5] etching the substrate utilizing the resulting mask.

The resist coating formed through the above-described steps has a hydrophobic surface; therefore, for example, during the planarization of roughness on a peripheral portion (such as a bevel portion or an edge portion) of a substrate by polishing, even if polishing is performed while water is being supplied to the resist coating surface, the surface repels water and cannot be covered with water; thus, polishing debris tends to adhere to the resist coating surface, and once adhered, the polishing debris is very difficult to remove. Moreover, the adhered polishing debris can be a cause of a short in the wiring or an increase in electrical resistance, which invites a decrease in reliability.

Furthermore, because the resist coating has a hydrophobic surface, the wettability of the developing liquid during the development is poor, and unevenness in development may occur, which makes it difficult to form a desired pattern with high precision on the substrate. In addition, during washing with water and drying of the resist coating after the development, the resist pattern may collapse because of an interfacial tension between the resist coating and water. This problem has become noticeable as the resist pattern has become finer and achieved a higher aspect ratio.

As a solution to the above-described problem, a method for imparting hydrophilicity to the resist coating surface to enhance the affinity between the resist coating and water is provided. As a method for imparting hydrophilicity to the resist coating surface, Patent Literature 1 discloses a method that involves coating the resist coating surface with a surfactant or a water-soluble polymer compound. This method, however, is disadvantageous in that the coating readily peels off when water is supplied to the resist coating surface, and the effect of imparting hydrophilicity does not last.

As a method for allowing the effect of imparting hydrophilicity to last, a method for imparting hydrophilicity by dissolving a small amount of the resist coating surface with an alkaline solution is provided. Patent Literature 2 discloses a TMAH (=tetramethylammonium hydroxide) solution, for example, as the alkaline solution to be used in this method. Patent Literature 3 discloses an aqueous solution containing a quaternary ammonium hydroxide such as 2-hydroxyethyl-(N,N-dimethyl-N-lauryl)ammonium hydroxide. However, hydrophilization treatments with these alkaline solutions make the resist coating thinner, and degrade the mask characteristics, leading to a decrease in yield.

CITATION LIST

Patent Literature

Patent Literature 1: Japanese Patent Laid-Open No. 2005-277050
Patent Literature 2: Japanese Patent Laid-Open No. 1997-106081
Patent Literature 3: Japanese Patent Laid-Open No. 2008-46153

SUMMARY OF INVENTION

Technical Problem

Accordingly, an object of the present invention is to provide an agent for resist hydrophilization treatment that can hydrophilize a surface of a resist coating rapidly and stably while inhibiting deterioration of the resist coating.

Another object of the present invention is to provide a developing liquid that has excellent wettability on a resist coating and can inhibit the occurrence of unevenness in development, and can inhibit a collapse of a resist pattern during washing with water and drying of the resist coating after development.

Still another object of the present invention is to provide a method for producing a semiconductor device having a wiring pattern with high precision in a good yield, while inhibiting adhesion of polishing debris and unevenness in development.

Solution to Problem

As a result of extensive research to solve the above-described problem, the inventor of the present invention has found that the composition containing the components shown below can hydrophilize a surface of a resist coating rapidly and stably while inhibiting deterioration of the resist coating; at the time of polishing of a semiconductor substrate, when the composition is applied to the resist coating surface and then the semiconductor substrate is polished while water is being supplied, the composition can inhibit adhesion of polishing debris to the resist coating, without causing deterioration of the resist coating; and the application of the composition to the resist coating surface at the time of development enhances the wettability of the developing liquid on the resist coating and can inhibit the occurrence of unevenness in development, and can inhibit a collapse of a resist pattern during washing with water and drying of the resist coating after development. The present invention has been completed on the basis of these findings.

In summary, the present invention provides an agent for resist hydrophilization treatment containing at least the following components (A) and (B):

component (A): a polyglycerol or a derivative thereof represented by the following formula (a):

wherein $R^a$ represents a hydrogen atom, a hydrocarbon group having 1 to 18 carbon atoms optionally having a hydroxyl group, or an acyl group having 2 to 24 carbon atoms; and n represents an average polymerization degree of glycerol units shown in the parentheses, and is an integer from 2 to 60;

component (B): water.

The present invention further provides the agent for resist hydrophilization treatment, wherein an amount of component (A) is not less than 0.1% by weight based on a total amount of the agent for resist hydrophilization treatment.

The present invention further provides the agent for resist hydrophilization treatment, wherein the resist is a positive resist.

The present invention further provides a resist developing liquid containing the agent for resist hydrophilization treatment.

The present invention further provides a method for producing a semiconductor device through the steps of subjecting a resist coating on a substrate to exposure and development to form a resist pattern for lithography, and etching the substrate utilizing the resulting resist pattern, the method including performing the following treatment [1] and/or treatment [2]:

[1] hydrophilizing a surface of the resist coating on the substrate with the agent for resist hydrophilization treatment, and then developing the resist coating, or developing the resist coating with a developing liquid containing the agent for resist hydrophilization treatment;

[2] hydrophilizing the resist coating with the agent for resist hydrophilization treatment, and then polishing roughness on a peripheral portion of the substrate including the resist coating while supplying water to the resist coating.

Advantageous Effects of Invention

Because the agent for resist hydrophilization treatment of the present invention has the above-described features, it readily forms a hydrophilic coating by rapidly adhering to the surface of the resist coating, and can stably hydrophilize the surface of the resist coating through the formation of the coating, thereby minimizing deterioration of the resist coating, compared to a method for imparting hydrophilicity by dissolving the resist coating surface with an alkaline solution.

Moreover, the developing liquid containing the agent for resist hydrophilization treatment of the present invention has high wettability on the resist coating and can inhibit the occurrence of unevenness in development, and can prevent a collapse of a resist pattern due to interfacial tension during washing with water and drying of the resist coating after development.

Furthermore, in the production of a semiconductor device, when the surface of the resist coating on the substrate is hydrophilized with the agent for resist hydrophilization treatment of the present invention, and then the resist coating is developed, or the resist coating is developed with the developing liquid containing the agent for resist hydrophilization treatment of the present invention, the occurrence of unevenness in development can be inhibited, and a collapse of the resist pattern due to interfacial tension can be prevented during washing with water and drying of the resist coating after development. In addition, when the resist coating is hydrophilized with the agent for resist hydrophilization treatment of the present invention, and then roughness on a peripheral portion of the substrate including the resist coating is polished while water is being supplied to the resist coating, adhesion of polishing debris to the resist coating can be inhibited. Therefore, a short in the wiring or an increase in electrical resistance that has been conventionally caused by the adhesion of polishing debris can be prevented, which prevents a decrease in yield, and allows a semiconductor device with high precision to be efficiently produced.

DESCRIPTION OF EMBODIMENTS

Agent for Resist Hydrophilization Treatment

An agent for resist hydrophilization treatment of the present invention comprises at least the following components (A) and (B):

component (A): a polyglycerol or a derivative thereof represented by formula (a);

component (B): water.

Component (A)

The agent for resist hydrophilization treatment of the present invention contains, as an essential component, a polyglycerol or a derivative thereof represented by the following formula (a):

wherein $R^a$ represents a hydrogen atom, a hydrocarbon group having 1 to 18 carbon atoms optionally having a hydroxyl group, or an acyl group having 2 to 24 carbon atoms; and n represents an average polymerization degree of glycerol units, and is an integer from 2 to 60.

In formula (a), n units of $C_3H_6O_2$ are the same or different, and each has a structure represented by following formula (a-1) or (a-2):

The hydrocarbon group having 1 to 18 carbon atoms in $R^a$ includes an alkyl group having 1 to 18 carbon atoms, an alkenyl group having 2 to 18 carbon atoms, an alkapolyenyl group having 2 to 18 carbon atoms, an alicyclic hydrocarbon group having 3 to 18 carbon atoms, an aromatic hydrocarbon group having 6 to 18 carbon atoms, and a group in which two or more of these groups are connected.

Examples of the alkyl group having 1 to 18 carbon atoms include linear or branched alkyl groups such as methyl, ethyl, n-propyl, 2-methyl-1-propyl, n-butyl, t-butyl, 3,3-dimethyl-2-butyl, n-pentyl, isopentyl, t-amyl, n-hexyl, 2-ethylhexyl, n-octyl, isooctyl, n-decyl, 4-decyl, isodecyl, dodecyl (=n-lauryl), isododecyl, tetradecyl (=myristyl), isomyristyl, cetyl, isocetyl, n-hexyldecyl, 2-hexyldecyl, stearyl, and isostearyl groups. Among the above, a linear or branched alkyl group having 8 to 18 carbon atoms is preferred.

Examples of the alkenyl group having 2 to 18 carbon atoms include linear or branched alkenyl groups such as vinyl, allyl, 2-butenyl, propenyl, hexenyl, 2-ethylhexenyl, and oleyl groups.

Examples of the alkapolyenyl group having 2 to 18 carbon atoms include alkadienyl groups such as butadienyl, pentadienyl, hexadienyl, heptadienyl, octadienyl, linoleyl, and linolyl groups; alkatrienyl groups such as a 1,2,3-pentatrienyl group; and alkatetraenyl groups.

Examples of the alicyclic hydrocarbon group having 3 to 18 carbon atoms include saturated or unsaturated alicyclic hydrocarbon groups such as cyclobutyl, cyclopentyl, cyclohexyl, cyclooctyl, cyclododecyl, 2-cycloheptenyl, and 2-cyclohexenyl groups (in particular, a cycloalkyl group and a cycloalkenyl group).

Examples of the aromatic hydrocarbon group having 6 to 18 carbon atoms include phenyl and naphthyl groups.

Examples of the group in which two or more of the above-mentioned groups are connected include benzyl, 2-phenylethenyl, 1-cyclopentylethyl, 1-cyclohexylethyl, cyclohexylmethyl, 2-cyclohexylethyl, and 1-cyclohexyl-1-methylethyl groups.

The acyl group having 2 to 24 carbon atoms includes an aliphatic acyl group and an aromatic acyl group. Examples of the aliphatic acyl group include saturated or unsaturated aliphatic acyl groups such as acetyl, propionyl, butyryl, isobutyryl, stearoyl, and oleoyl groups. Examples of the aromatic acyl group include benzoyl, toluoyl, and naphthoyl groups.

Among the above, $R^a$ is preferably a hydrogen atom, a linear or branched alkyl group (particularly a linear or branched alkyl group having 8 to 18 carbon atoms, and more particularly a linear or branched alkyl group having 10 to 18 carbon atoms), a linear or branched alkenyl group (particularly a linear or branched alkenyl group having 2 to 18 carbon atoms, and more particularly a linear or branched alkenyl group having 2 to 8 carbon atoms), or an aliphatic acyl group (particularly a saturated aliphatic acyl group having 10 to 18 carbon atoms); and particularly preferably a hydrogen atom, the alkyl group, or the alkenyl group.

In formula (a), n represents an average polymerization degree of glycerol units shown in the parentheses. The n is an integer from 2 to 60. The lower limit of n is preferably 5, more preferably 10, still more preferably 15, particularly preferably 20, most preferably 25, and especially preferably 30. The upper limit of n is preferably 55, more preferably 50, particularly preferably 45, and most preferably 40. The polyglycerol or a derivative thereof in which n is in the above-mentioned range readily forms a coating by adhering to the surface of the resist coating, and can stably hydrophilize the resist coating surface through the formation of the coating.

The weight average molecular weight of the polyglycerol or a derivative thereof is, for example, 200 to 20000, preferably 600 to 15000, more preferably 1000 to 10000, particularly preferably 1500 to 5000, and most preferably 2000 to 4500. The polyglycerol or a derivative thereof having a weight average molecular weight in the above-mentioned range has particularly excellent adhesiveness to the surface of the resist coating, and does not peel off when water is supplied to the resist coating surface, and therefore, can maintain the effect of imparting hydrophilicity to the resist coating surface stably over time. As used herein, the weight average molecular weight refers to the molecular weight as measured by gel permeation chromatography (GPC) relative to standard polystyrene.

In particular, at least one selected from compounds represented by the following formulas is preferably used as the polyglycerol or a derivative thereof:

HO—(C$_3$H$_6$O$_2$)$_{10}$—H

HO—(C$_3$H$_6$O$_2$)$_{20}$—H

HO—(C$_3$H$_6$O$_2$)$_{30}$—H

HO—(C$_3$H$_6$O$_2$)$_{40}$—H

CH$_2$=CHCH$_2$—O—(C$_3$H$_6$O$_2$)$_6$—H

C$_{12}$H$_{25}$O—(C$_3$H$_6$O$_2$)$_4$—H

C$_{12}$H$_{25}$O—(C$_3$H$_6$O$_2$)$_{10}$—H

C$_{18}$H$_{37}$O—(C$_3$H$_6$O$_2$)$_4$—H

C$_{18}$H$_{37}$O—(C$_3$H$_6$O$_2$)$_{10}$—H

As the polyglycerol (i.e., a compound of formula (a) wherein $R^a$ is a hydrogen atom) of the polyglycerol or a derivative thereof, a commercially available product can be suitably used, for example, trade name "PGL 03P" (polyglycerol-3), "PGL 06" (polyglycerol-6), "PGL 10PSW" (polyglycerol-10), "PGL 20PW" (polyglycerol-20), or "PGL XPW" (polyglycerol-40) (all available from Daicel Corporation).

The polyglycerol derivative (i.e., a compound of formula (a) wherein $R^a$ is a hydrocarbon group having 1 to 18 carbon atoms optionally having a hydroxyl group or an acyl group having 2 to 24 carbon atoms) of the polyglycerol or a derivative thereof can be produced using various methods. Examples of methods for producing the polyglycerol derivative include the methods described below, but the polyglycerol derivative of the present invention is not limited to those produced using these methods:

(1) a method in which $R^a$OH ($R^a$ is as defined above) is addition polymerized with 2,3-epoxy-1-propanol; and (2) a method in which a polyglycerol is condensed with an alkyl halide (for example, $R^{a1}$X: X represents a halogen atom; and $R^{a1}$ represents a hydrocarbon group having 1 to 18 carbon atoms), a carboxylic acid (for example, $R^{a2}$OH: $R^{a2}$ represents an acyl group having 2 to 24 carbon atoms), or a derivative thereof (for example, a carboxylic acid halide or an acid anhydride).

In Method (1), the addition reaction is preferably performed in the presence of an alkali catalyst. Examples of the alkali catalyst include sodium hydroxide, potassium hydroxide, lithium hydroxide, metallic sodium, and sodium hydride. These alkali catalysts can be used singly or in combination of two or more.

The above-mentioned commercially available products can be suitably used as the polyglycerol used as a raw material in Method (2).

The agent for resist hydrophilization treatment of the present invention contains, as component (A), one, or two or more selected from polyglycerols and polyglycerol derivatives (specifically, polyglycerol monoethers, polyglycerol monoesters, and the like). The agent for resist hydrophilization treatment of the present invention may also contain a polyglycerol diether and a polyglycerol diester corresponding to the polyglycerol or a derivative thereof represented by formula (a), in which case the proportion of the polyglycerol or a derivative thereof represented by formula (a) is preferably not less than 75%, and particularly preferably not less than 90%, relative to the total proportion of the polyglycerol or a derivative thereof represented by formula (a) and the corresponding polyglycerol diether and polyglycerol diester. The proportion of the polyglycerol diether and polyglycerol diester is preferably not more than 5%, and particularly preferably not more than 1%. The proportion of each component can be determined from the area ratio obtained by eluting each component using high performance chromatography, and calculating the peak area with a differential refractive index detector.

The amount of component (A) in the agent for resist hydrophilization treatment of the present invention is, for example, not less than 0.1% by weight, preferably 0.1 to 5.0% by weight, more preferably 0.3 to 4.0% by weight, particularly preferably 0.5 to 3.0% by weight, and most preferably 0.5 to 2.5% by weight, based on the total amount (100% by weight) of the agent for resist hydrophilization treatment.

Component (B)

The agent for resist hydrophilization treatment of the present invention contains water as an essential component. The water may be either hard water or soft water; for example, industrial water, tap water, ion exchange water, or distilled water can be used.

The amount of water in the agent for resist hydrophilization treatment of the present invention is, for example, 80.0 to 99.9% by weight, preferably 85.0 to 99.9% by weight, more preferably 90.0 to 99.8% by weight, and particularly preferably 95.0 to 99.5% by weight, based on the total amount (100% by weight) of the agent for resist hydrophilization treatment.

Method for Producing Agent for Resist Hydrophilization Treatment

The agent for resist hydrophilization treatment of the present invention contains component (A) and component (B) as essential components. The agent for resist hydrophilization treatment of the present invention may contain other components other than components (A) and (B).

Examples of the other components include anionic surfactants (such as polycarboxylate-based, polyacrylate-based, and alkylbenzenesulfonate-based surfactants), cationic surfactants (such as quaternary ammonium salts, for example, alkyl trimethyl ammonium chloride and alkyl pyridinium chloride), nonionic surfactants (such as acetylenediol-based surfactants, polyoxyalkylene alkyl ethers, polyoxyethylene alkyl amines, and polyvinyl pyrrolidone), water-soluble polymer compounds (such as celluloses and chitosans), organic bases (such as TMAH and diethylethanolamine), and alcohols (such as methanol, ethanol, and isopropyl alcohol). These components can be used singly or in combination of two or more.

The proportion of the total amount of components (A) and (B) in the total amount (100% by weight) of the agent for resist hydrophilization treatment of the present invention is, for example, not less than 70% by weight, preferably not less than 80% by weight, particularly preferably not less than 90% by weight, and most preferably not less than 95% by weight. The upper limit of the proportion of the total amount of components (A) and (B) is 100% by weight. Thus, the amount of the other components (if two or more other components are contained, the total amount of these components) is, for example, not more than 30% by weight, preferably not more than 20% by weight, particularly preferably not more than 10% by weight, and most preferably not more than 5% by weight, based on the total amount (100% by weight) of the agent for resist hydrophilization treatment of the present invention.

The agent for resist hydrophilization treatment of the present invention can be prepared by mixing components (A) and (B) with other components, as required.

Resist Developing Liquid

The resist developing liquid of the present invention contains the agent for resist hydrophilization treatment.

The amount of component (A) is, for example, not less than 0.1% by weight, preferably 0.1 to 5.0% by weight, more preferably 0.3 to 4.0% by weight, particularly preferably 0.5 to 3.0% by weight, and most preferably 0.5 to 2.5% by weight, based on the total amount (100% by weight) of the resist developing liquid of the present invention.

The resist developing liquid of the present invention also contains well-known and conventional components of developing liquids other than the agent for resist hydrophilization treatment. For example, when the resist is a positive resist, the resist developing liquid may contain one, or two or more selected from inorganic bases (such as sodium hydroxide, potassium hydroxide, sodium carbonate, sodium silicate, sodium metasilicate, and aqueous ammonia), primary amines (such as ethylamine and n-propylamine), secondary amines (such as diethylamine and di-n-butylamine), tertiary amines (such as triethylamine and methyldiethylamine), alcohol amines (such as dimethylethanolamine and triethanolamine), quaternary ammonium salts (such as tetramethylammonium hydroxide and tetraethylammonium hydroxide), cyclic amines (such as pyrrole and piperidine), alcohols, and surfactants.

Because the resist developing liquid of the present invention contains the agent for resist hydrophilization treatment (particularly component (A)), it has excellent wettability on a resist coating and can inhibit the occurrence of unevenness in development, and can alleviate the interfacial tension between a resist pattern and water during washing with water and drying of the resist coating after development to inhibit a collapse of the resist pattern.

Method for Producing Semiconductor Device

The method for producing a semiconductor device of the present invention is a method for producing a semiconductor device through the steps of subjecting a resist coating on a substrate to exposure and development to form a resist pattern for lithography, and etching the substrate utilizing the resulting resist pattern (i.e., a method for producing a semiconductor device using photolithography), the method including performing the following treatment [1] and/or treatment [2]:

[1] hydrophilizing a surface of the resist coating on the substrate with the agent for resist hydrophilization treatment of the present invention, and then developing the resist coating, or developing the resist coating with the developing liquid containing the agent for resist hydrophilization treatment of the present invention;

[2] hydrophilizing the resist coating with the agent for resist hydrophilization treatment of the present invention, and then polishing roughness on a peripheral portion of the substrate including the resist coating while supplying water to the resist coating.

The resist for forming the resist coating includes a positive resist and a negative resist. In the present invention, it is preferred to use particularly a positive resist, since it can form a fine pattern with higher precision.

The positive resist is not particularly limited, and examples thereof include novolak resin, polyacrylic acid, poly-p-hydroxystyrene, polynorbornene resin, and resins obtained by introducing fluorine into these resins.

Examples of methods for forming the resist coating on the substrate include a method in which the resist is applied onto the substrate using a spin coating method, a roll coating method, a dipping method, a spraying method, a curtain flow coating method, a screen printing method, an offset printing method, or a gravure coating method. The thickness of the resist coating is, for example, approximately several hundred nm to several hundred μm.

The obtained resist coating may be subjected to a pre-bake treatment before being subjected to an exposure treatment. Alternatively, a bake treatment may be performed after the exposure treatment. The pre-bake treatment or bake treatment can enhance the adhesiveness between the substrate and the resist coating. The treatment temperature is, for example, 100 to 150° C., and the treatment time is, for example, about 1 to 30 minutes.

Furthermore, after the development, the resist coating is preferably washed with water and dried. In the present invention, the resist coating surface is hydrophilized with the agent for resist hydrophilization treatment; thus, even though the resist coating is washed with water, the interfacial tension between water and the resist pattern can be alleviated, and a collapse of the resist pattern can be inhibited.

The method for hydrophilizing the surface of the resist coating with the agent for resist hydrophilization treatment of the present invention is not particularly limited, as long as it allows the agent for resist hydrophilization treatment of the present invention to be brought into contact with the resist coating surface. Examples of the method for bringing the agent for resist hydrophilization treatment of the present invention into contact with the resist coating surface include (1) a spraying method, (2) a dropping method, and (3) an immersion method.

For example, in the case of the spraying method (1) or the dropping method (2), the substrate including the resist coating is rotated and simultaneously, the agent for resist hydrophilization treatment of the present invention is sprayed or dropped onto the substrate from a nozzle disposed above the substrate, such that the agent for resist hydrophilization treatment of the present invention can be applied over the entire surface of the resist coating on the substrate to hydrophilize the resist coating surface.

In the case of the immersion method (3), the substrate including the resist coating is immersed in the agent for resist hydrophilization treatment of the present invention to hydrophilize the resist coating surface.

In any of the above methods, the time required for the hydrophilization treatment is, for example, 5 to 60 seconds, and preferably 10 to 30 seconds. If the treatment time is excessively short, the hydrophilization will be insufficient, and if the treatment time is excessively long, the operation efficiency will be lower, which is undesirable. Furthermore, the agent for resist hydrophilization treatment of the present invention has high wettability on the resist coating surface; thus, when the dropping method (2) is adopted, the amount of the agent for resist hydrophilization treatment required to coat the entire surface of the semiconductor substrate is small, allowing for a reduction in costs.

The present invention is characterized in that, before the resist coating is subjected to a development treatment, the surface of the resist coating on the substrate is hydrophilized with the agent for resist hydrophilization treatment of the present invention, or the resist coating is developed with the developing liquid containing the agent for resist hydrophilization treatment of the present invention. This achieves good wettability of the developing liquid on the resist coating, allowing the occurrence of unevenness in development to be inhibited. Furthermore, during washing with water and drying of the resist coating after the development, a collapse of the resist pattern due to interfacial tension can be inhibited.

Furthermore, the present invention is characterized in that, the resist coating is hydrophilized with the agent for resist hydrophilization treatment of the present invention, and then roughness on a peripheral portion of the substrate including the resist coating is polished while water is being supplied to the resist coating.

Examples of methods for polishing roughness on the peripheral portion of the substrate include a method in which a polishing tool such as a polishing pad or a polishing tape is pressed against the peripheral portion of the substrate that is being rotated. An abrasive can also be used for polishing.

Examples of methods for supplying water include a method in which water is dropped continuously or intermittently from a water supply nozzle. When water is dropped onto the substrate including the resist coating that is being rotated, water is caused to flow outward by centrifugal force to cover the entire surface of the substrate including the resist coating. The speed and the amount of water supply are not particularly limited, and can be adjusted as appropriate.

As water to be supplied, water alone (for example, ultrapure water) may be used, or water containing other components (for example, a surfactant) may be used. Furthermore, during the supply of water, the resist coating surface may be simultaneously subjected to physical cleaning (for example, ultrasonic cleaning, brush cleaning, or jet cleaning).

When the peripheral portion of the substrate is subjected to a polishing treatment using the above-described method, adhesion of polishing debris to the resist coating can be inhibited, and hence, a short in the wiring or an increase in electrical resistance caused by polishing debris can be prevented. Moreover, because roughness on the peripheral portion of the substrate is planarized (or mirror-finished) by polishing, any rough portion on the peripheral portion of the substrate can be prevented from becoming dust in a subsequent step (for example, transport), and hence, a short in the wiring or an increase in electrical resistance caused by such dust can be prevented.

Furthermore, the agent for resist hydrophilization treatment and the resist developing liquid used in the present invention form a coating through adhesion of component (A) to the surface of the resist coating to stably hydrophilize the resist coating surface, and can achieve hydrophilization without making the resist coating thinner, such that the mask characteristics of the resist coating are not impaired.

As described above, in accordance with the method for producing a semiconductor device of the present invention, a semiconductor device with high precision can be efficiently produced.

EXAMPLES

The present invention will be hereinafter described in more detail with examples; however, the present invention is not limited to these examples.

Examples 1 to 4 and Comparative Examples 1 to 4

Agents for resist hydrophilization treatment were obtained by blending each component in accordance with the formulations shown in Table 1. For each of the obtained agents for resist hydrophilization treatment, the ability to hydrophilize a resist coating surface and the property of preventing deterioration of a resist coating were evaluated in the following manner.

A positive resist (trade name "Nagase Positive Resist 820" from Nagase & Co., Ltd.) was applied onto a silicon wafer by spin coating, and then baked for 10 minutes at 120° C. to give a specimen (resist coating thickness: about 1700 nm).

The specimen was immersed in each of the agents for resist hydrophilization treatment obtained in the Examples and Comparative Examples for 10 seconds at 25° C. without being stirred, and then rinsed under running ultrapure water for 3 minutes. After the rinsing, the specimen was removed, and then the wettability on the resist coating surface was visually examined, and the hydrophilization ability was evaluated on the basis of the criteria shown below. Moreover, damage to the resist coating was evaluated by measuring an amount of decrease in coating thickness after the treatment compared to the coating thickness before the treatment, using an optical interference-type coating thickness meter. A smaller amount of decrease in resist coating thickness means less damage to the resist coating, and hence, a superior property of preventing deterioration of the resist coating. The results are shown in Table 1.

Evaluation Criteria

○: After the specimen was removed, the surface of the specimen remained wet.

x: After the specimen was removed, water is immediately or gradually repelled by the specimen.

TABLE 1

| Resist Treatment Agent | | Ability to Hydrophilize Resist Surface | Amount of Decrease (nm) in Resist Coating Thickness (nm) |
|---|---|---|---|
| Component | % by Weight | | |
| Example 1 | a-1 | 2 | ○ | 0.1 |
| Example 2 | a-1 | 1.5 | ○ | 0.3 |
| Example 3 | a-1 | 1 | ○ | 0.3 |
| Example 4 | a-1 | 0.5 | ○ | 0.1 |
| Comparative Example 1 | b-1 | 1 | x | 2.0 |
| Comparative Example 2 | b-2 | 1 | ○ | 4.1 |
| Comparative Example 3 | b-3 | 1 | ○ | 7.4 |
| Comparative Example 4 | b-4 | 1 | x | 3.6 |

The symbols in the table denote the following compounds:

a-1: polyglycerol-40, trade name "PGL XPW" from Daicel Corporation b-1: TMAH b-2: 2-hydroxyethyl-(N,N-dimethyl-N-lauryl)ammonium hydroxide b-3: 2-hydroxyethyl-(N,N-dimethyl-N-myristyl)ammonium hydroxide b-4: 2-hydroxyethyl-(N,N-dimethyl-N-stearyl)ammonium hydroxide The configuration of the present invention and variations thereof may be summarized as follows.

[1] An agent for resist hydrophilization treatment comprising at least the following components (A) and (B):

component (A): a polyglycerol or a derivative thereof represented by the following formula (a):

$$R^{a}O\text{---}(C_3H_6O_2)_n\text{---}H \quad (a)$$

wherein $R^a$ represents a hydrogen atom, a hydrocarbon group having 1 to 18 carbon atoms optionally having a hydroxyl group, or an acyl group having 2 to 24 carbon atoms; and n represents an average polymerization degree of glycerol units shown in the parentheses, and is an integer from 2 to 60;

component (B): water.

[2] The agent for resist hydrophilization treatment according to [1], wherein an amount of component (A) is not less than 0.1% by weight based on a total amount of the agent for resist hydrophilization treatment.

[3] The agent for resist hydrophilization treatment according to [1] or [2], wherein the resist is a positive resist.

[4] The agent for resist hydrophilization treatment according to any one of [1] to [3], wherein the positive resist includes at least one selected from the group consisting of novolak resin, polyacrylic acid, poly-p-hydroxystyrene, polynorbornene resin, and resins obtained by introducing fluorine into these resins.

[5] The agent for resist hydrophilization treatment according to any one of [1] to [4], wherein each of n units of $C_3H_6O_2$ in formula (a) has a structure represented by following formula (a-1) or (a-2):

$$\text{---}CH_2\text{---}CHOH\text{---}CH_2O\text{---} \quad (a\text{-}1)$$

$$\text{---}CH(CH_2OH)CH_2O\text{---} \quad (a\text{-}2)$$

[6] The agent for resist hydrophilization treatment according to any one of [1] to [5], wherein the hydrocarbon group having 1 to 18 carbon atoms in $R^a$ includes an alkyl group having 1 to 18 carbon atoms, an alkenyl group having 2 to 18 carbon atoms, an alkapolyenyl group having 2 to 18 carbon atoms, an alicyclic hydrocarbon group having 3 to 18 carbon atoms, an aromatic hydrocarbon group having 6 to 18 carbon atoms, and a group in which two or more of these groups are connected.

[7] The agent for resist hydrophilization treatment according to any one of [1] to [6], wherein the hydrocarbon group having 1 to 18 carbon atoms in $R^a$ includes at least one selected from the group consisting of methyl, ethyl, n-propyl, 2-methyl-1-propyl, n-butyl, t-butyl, 3,3-dimethyl-2-butyl, n-pentyl, isopentyl, t-amyl, n-hexyl, 2-ethylhexyl, n-octyl, isooctyl, n-decyl, 4-decyl, isodecyl, dodecyl (=n-lauryl), isododecyl, tetradecyl (=myristyl), isomyristyl, cetyl, isocetyl, n-hexyldecyl, 2-hexyldecyl, stearyl, and isostearyl groups; vinyl, allyl, 2-butenyl, propenyl, hexenyl, 2-ethylhexenyl, and oleyl groups; butadienyl, pentadienyl, hexadienyl, heptadienyl, octadienyl, linoleyl, and linolyl groups; 1,2,3-pentatrienyl group and alkatetraenyl groups; cyclobutyl, cyclopentyl, cyclohexyl, cyclooctyl, cyclododecyl, 2-cycloheptenyl, and 2-cyclohexenyl groups; phenyl and naphthyl groups; benzyl, 2-phenylethenyl, 1-cyclopentylethyl, 1-cyclohexylethyl, cyclohexylmethyl, 2-cyclohexylethyl, and 1-cyclohexyl-1-methylethyl groups.

[8] The agent for resist hydrophilization treatment according to any one of [1] to [7], wherein the acyl group having 2 to 24 carbon atoms includes at least one selected from the group consisting of acetyl, propionyl, butyryl, isobutyryl, stearoyl, and oleoyl groups; benzoyl, toluoyl, and naphthoyl groups.

[9] The agent for resist hydrophilization treatment according to any one of [1] to [8], wherein n in formula (a) is an integer from 2 to 60, the lower limit of n is any one selected from the group consisting of 5, 10, 15, 20, 25 and 30, and the upper limit of n is any one selected from the group consisting of 55, 50, 45 and 40.

[10] The agent for resist hydrophilization treatment according to any one of [1] to [9], wherein the weight average molecular weight of the polyglycerol or a derivative thereof is selected from the group consisting of 200 to 20000, 600 to 15000, 1000 to 10000, 1500 to 5000, and 2000 to 4500.

[11] The agent for resist hydrophilization treatment according to any one of [1] to [10], wherein at least one selected from compounds represented by the following formulas:

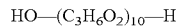

$$HO\text{---}(C_3H_6O_2)_{10}\text{---}H$$

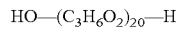

$$HO\text{---}(C_3H_6O_2)_{20}\text{---}H$$

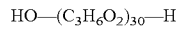

$$HO\text{---}(C_3H_6O_2)_{30}\text{---}H$$

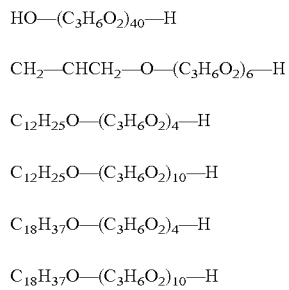

is preferably used as the polyglycerol or a derivative thereof.

[12] The agent for resist hydrophilization treatment according to any one of [1] to [11], wherein the proportion of the polyglycerol or a derivative thereof represented by formula (a) is not less than 75% or not less than 90%, relative to the total proportion of the polyglycerol or a derivative thereof represented by formula (a) and the corresponding polyglycerol diether and polyglycerol diester, and the proportion of the polyglycerol diether and polyglycerol diester is not more than 5% or not more than 1%.

[13] The agent for resist hydrophilization treatment according to any one of [1] to [12], wherein the amount of component (A) in the agent for resist hydrophilization treatment is selected from the group consisting of not less than 0.1% by weight, 0.1 to 5.0% by weight, 0.3 to 4.0% by weight, 0.5 to 3.0% by weight and 0.5 to 2.5% by weight, based on the total amount (100% by weight) of the agent for resist hydrophilization treatment.

[14] The agent for resist hydrophilization treatment according to any one of [1] to [13], wherein the amount of water in the agent for resist hydrophilization treatment is selected from the group consisting of 80.0 to 99.9% by weight, 85.0 to 99.9% by weight, 90.0 to 99.8% by weight and 95.0 to 99.5% by weight, based on the total amount (100% by weight) of the agent for resist hydrophilization treatment.

[15] The agent for resist hydrophilization treatment according to any one of [1] to [14], wherein the agent for resist hydrophilization treatment further contains a component other than components (A) and (B), and the other component includes at least one selected from the group consisting of polycarboxylate-based surfactants, polyacrylate-based surfactants, alkylbenzenesulfonate-based surfactants, alkyl trimethyl ammonium chloride, alkyl pyridinium chloride, acetylenediol-based surfactants, polyoxyalkylene alkyl ethers, polyoxyethylene alkyl amines, polyvinyl pyrrolidone, celluloses, chitosans, TMAH, diethylethanolamine, methanol, ethanol, and isopropyl alcohol.

[16] The agent for resist hydrophilization treatment according to any one of [1] to [15], wherein the proportion of the total amount of components (A) and (B) in the total amount (100% by weight) of the agent for resist hydrophilization treatment is selected from the group consisting of not less than 70% by weight, not less than 80% by weight, not less than 90% by weight, not less than 95% by weight, and 100% by weight, and the amount of the components other than components (A) and (B) is selected from the group consisting of not more than 30% by weight, not more than 20% by weight, not more than 10% by weight and not more than 5% by weight, based on the total amount (100% by weight) of the agent for resist hydrophilization treatment.

[17] A resist developing liquid comprising the agent for resist hydrophilization treatment according to any one of [1] to [16].

[18] The resist developing liquid according to [17], wherein the amount of component (A) is selected from the group consisting of not less than 0.1% by weight, 0.1 to 5.0% by weight, 0.3 to 4.0% by weight, 0.5 to 3.0% by weight and 0.5 to 2.5% by weight, based on the total amount (100% by weight) of the resist developing liquid.

[19] The resist developing liquid according to [17] or [18], wherein the resist developing liquid further contains at least one selected from the group consisting of sodium hydroxide, potassium hydroxide, sodium carbonate, sodium silicate, sodium metasilicate and aqueous ammonia; ethylamine and n-propylamine; diethylamine and di-n-butylamine; triethylamine and methyldiethylamine; dimethylethanolamine and triethanolamine, tetramethylammonium hydroxide and tetraethylammonium hydroxide; pyrrole and piperidine, alcohols, and surfactants.

[20] A method for producing a semiconductor device through the steps of subjecting a resist coating on a substrate to exposure and development to form a resist pattern for lithography, and etching the substrate utilizing the resulting resist pattern, the method comprising performing the following treatment [i] and/or treatment [ii]:

[i] hydrophilizing a surface of the resist coating on the substrate with the agent for resist hydrophilization treatment according to any one of [1] to [16], and then developing the resist coating, or developing the resist coating with a developing liquid comprising the agent for resist hydrophilization treatment according to any one of [1] to [16];

[ii] hydrophilizing the resist coating with the agent for resist hydrophilization treatment according to any one of [1] to [16], and then polishing roughness on a peripheral portion of the substrate comprising the resist coating while supplying water to the resist coating.

[21] The method for producing a semiconductor device according to [20], wherein the method for forming the resist coating on the substrate includes at least one selected from the group consisting of a spin coating method, a roll coating method, a dipping method, a spraying method, a curtain flow coating method, a screen printing method, an offset printing method and a gravure coating method, and the thickness of the resist coating is approximately several hundred nm to several hundred μm.

[22] The method for producing a semiconductor device according to [20] or [21], wherein the obtained resist coating is subjected to a pre-bake treatment before being subjected to an exposure treatment or a bake treatment is performed after the exposure treatment, the treatment temperature is 100 to 150° C., and the treatment time is 1 to 30 minutes.

[23] The method for producing a semiconductor device according to any one of [20] to [22], wherein after the development, the resist coating is further washed with water and dried.

[24] The method for producing a semiconductor device according to any one of [20] to [23], wherein the method for hydrophilizing the surface of the resist coating with the agent for resist hydrophilization treatment allows the agent for resist hydrophilization treatment to be brought into contact with the resist coating surface, and the method for bringing the agent for resist hydrophilization treatment into contact with the resist coating surface is selected from the group consisting of (1) a spraying method, (2) a dropping method, and (3) an immersion method.

[25] The method for producing a semiconductor device according to any one of [20] to [24], wherein the method for polishing roughness on the peripheral portion of the substrate includes a method in which a polishing pad or a polishing tape is pressed against the peripheral portion of the substrate being rotated, or an abrasive is used for polishing.

[26] The method for producing a semiconductor device according to any one of [20] to [25], wherein the method for supplying water includes a method in which water is dropped continuously or intermittently from a water supply nozzle.

[27] The method for producing a semiconductor device according to any one of [20] to [26], wherein during the supply of water, the resist coating surface is simultaneously subjected to physical cleaning selected from the group consisting of ultrasonic cleaning, brush cleaning, and jet cleaning.

INDUSTRIAL APPLICABILITY

The present invention provides an agent for resist hydrophilization treatment that can hydrophilize a surface of a resist coating rapidly and stably while inhibiting deterioration of the resist coating. Furthermore, the present invention provides a developing liquid that has excellent wettability on a resist coating and can inhibit the occurrence of unevenness in development, and can inhibit a collapse of a resist pattern during washing with water and drying of the resist coating after development. Moreover, the present invention provides a method for producing a semiconductor device having a wiring pattern with high precision in a good yield, while inhibiting adhesion of polishing debris and unevenness in development.

The invention claimed is:

1. A method for producing a semiconductor device through the steps of subjecting a resist coating on a substrate to exposure and development to form a resist pattern for lithography, and etching the substrate utilizing the resulting resist pattern, the method comprising performing the following treatment [1] and/or treatment [2]:
   [1] hydrophilizing a surface of the resist coating on the substrate with an agent for resist hydrophilization treatment, and then developing the resist coating, or developing the resist coating with a developing liquid comprising the agent for resist hydrophilization treatment;
   [2] hydrophilizing the resist coating with the agent for resist hydrophilization treatment, and then polishing roughness on a peripheral portion of the substrate comprising the resist coating while supplying water to the resist coating,
   wherein the agent for resist hydrophilization treatment comprises at least the following components (A) and (B):
   component (A): a polyglycerol or a derivative thereof represented by the following formula (a):

wherein $R^a$ represents a hydrogen atom, a linear or branched alkyl group having 8 to 18 carbon atoms, or a linear or branched alkenyl group having 2 to 18 carbon atoms; and n represents an average polymerization degree of glycerol units shown in the parentheses, and is an integer from 15 to 60;
   component (B): water.

2. The method for producing a semiconductor device according to claim 1, wherein the component (A) is at least one selected from compounds represented by the following formulas:

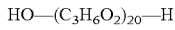
   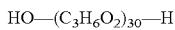
   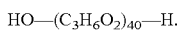

3. The method for producing a semiconductor device according to claim 1, wherein an amount of component (A) is 0.5% to 2.5% by weight based on a total amount of the agent for resist hydrophilization treatment.

4. A method for producing a semiconductor device through the steps of subjecting a resist coating on a substrate to exposure and development to form a resist pattern for lithography, and etching the substrate utilizing the resulting resist pattern, the method comprising performing the following treatment [1] and/or treatment [2]:
   [1] hydrophilizing a surface of the resist coating on the substrate with an agent for resist hydrophilization treatment, and then developing the resist coating, or developing the resist coating with a developing liquid comprising the agent for resist hydrophilization treatment;
   [2] hydrophilizing the resist coating with the agent for resist hydrophilization treatment, and then polishing roughness on a peripheral portion of the substrate comprising the resist coating while supplying water to the resist coating,
   wherein the agent for resist hydrophilization treatment comprises at least the following components (A) and (B):
   component (A): a polyglycerol or a derivative thereof represented by the following formula (a):

$$R^aO—(C_3H_6O_2)_n—H \qquad (a)$$

wherein $R^a$ represents a hydrogen atom, a linear or branched alkyl group having 8 to 18 carbon atoms, or a linear or branched alkenyl group having 2 to 18 carbon atoms; and n represents an average polymerization degree of glycerol units shown in the parentheses, and is an integer from 15 to 60;
   component (B): water, and
   an amount of component (A) is not less than 0.1% by weight based on a total amount of the agent for resist hydrophilization treatment.

5. A method for producing a semiconductor device through the steps of subjecting a resist coating on a substrate to exposure and development to form a resist pattern for lithography, and etching the substrate utilizing the resulting resist pattern, the method comprising performing the following treatment [1] and/or treatment [2]:
   [1] hydrophilizing a surface of the resist coating on the substrate with an agent for resist hydrophilization treatment as follows, and then developing the resist coating, or developing the resist coating with a developing liquid comprising the agent for resist hydrophilization treatment;
   [2] hydrophilizing the resist coating with the agent for resist hydrophilization treatment, and then polishing roughness on a peripheral portion of the substrate comprising the resist coating while supplying water to the resist coating,
   wherein the agent for resist hydrophilization treatment comprises at least the following components (A) and (B):
   component (A): a polyglycerol or a derivative thereof represented by the following formula (a):

wherein $R^a$ represents a hydrogen atom, a linear or branched alkyl group having 8 to 18 carbon atoms, or a linear or branched alkenyl group having 2 to 18 carbon atoms; and n represents an average polymerization degree of glycerol units shown in the parentheses, and is an integer from 15 to 60;

component (B): water, and
wherein the resist is a positive resist.

6. A method for hydrophilizing a surface of a resist coating, comprising:
hydrophilizing the surface of the resist coating with an agent for resist hydrophilization treatment comprising at least the following components (A) and (B):
component (A): a polyglycerol or a derivative thereof represented by the following formula (a):

$$R^{a}O\!-\!(C_3H_6O_2)_n\!-\!H \quad (a)$$

wherein $R^a$ represents a hydrogen atom, a linear or branched alkyl group having 8 to 18 carbon atoms, or a linear or branched alkenyl group having 2 to 18 carbon atoms; and n represents an average polymerization degree of glycerol units shown in the parentheses, and is an integer from 15 to 60;
component (B): water.

7. The method for hydrophilizing a surface of a resist coating according to claim 6, wherein an amount of component (A) is not less than 0.1% by weight based on a total amount of the agent for resist hydrophilization treatment.

8. The method for hydrophilizing a surface of a resist coating according to claim 6, wherein the resist is a positive resist.

* * * * *